United States Patent
Yu et al.

(10) Patent No.: US 11,005,642 B1
(45) Date of Patent: May 11, 2021

(54) OUTPUT CIRCUIT FOR A SOURCE DEVICE WITH ARBITRARY ACCESS TIME

(71) Applicant: TEXAS INSTRUMENTS INCORPORATED, Dallas, TX (US)

(72) Inventors: Shawn Xianggang Yu, Tucson, AZ (US); Venkata Krishnan Kidambi Srinivasan, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/900,082

(22) Filed: Jun. 12, 2020

(51) Int. Cl.
*H04L 7/00* (2006.01)
*H03M 1/06* (2006.01)
*G11C 19/28* (2006.01)

(52) U.S. Cl.
CPC ............ *H04L 7/0037* (2013.01); *G11C 19/28* (2013.01); *H03M 1/0624* (2013.01); *H04L 7/0087* (2013.01); *H04L 7/0091* (2013.01)

(58) Field of Classification Search
CPC ... H04L 1/0027; H04L 7/0037; H04L 7/0091; H04L 7/0087; H03M 1/0624; G11C 19/28; G11C 29/023; G11C 7/22; G06F 13/1689

USPC ......................................................... 375/355
See application file for complete search history.

(56) References Cited

U.S. PATENT DOCUMENTS

| | | | |
|---|---|---|---|
| 9,641,680 B1 * | 5/2017 | Wold ................... | G06F 16/337 |
| 2010/0244853 A1 * | 9/2010 | Tong .............. | G01R 31/318566 |
| | | | 324/537 |

* cited by examiner

*Primary Examiner* — Leila Malek
(74) *Attorney, Agent, or Firm* — John R. Pessetto; Charles A. Brill; Frank D. Cimino

(57) ABSTRACT

A circuit includes a source device coupled to an output circuit. The source device is configured to produce a sequence of digital values at a rate defined by a data period. The output circuit is configured to receive the sequence of digital values from the source device, generate a copy of each digital value at a predetermined point during the respective data period, and responsive to initiation of a data transaction during a given data period but before the predetermined point, output the digital value from the source device, whereas responsive to initiation of a data transaction during the given data period but after the predetermined point, output the copy of the digital value.

20 Claims, 6 Drawing Sheets

OUTPUT CIRCUIT FOR A SOURCE DEVICE WITH ARBITRARY ACCESS TIME

BACKGROUND

Some devices generate data for storage in a small buffer. As each data value is stored in the buffer, a receiving device reads the data value from the buffer before the source device overwrites the previous data value with a new data value. In some such systems, the source and receiving devices operate in different clock domains. That is, the two clocks may not be synchronized to one another. Because the docks are not synchronized, there is a chance that the receiving device will attempt to read the buffer at the exact moment that the source device is attempting to overwrite the buffer with a new data value. The integrity of the data read from the buffer is not ensured due to this timing problem.

SUMMARY

In at least one example, a circuit includes a source device (e.g., an analog-to-digital converter) coupled to an output circuit. The source device is configured to produce a sequence of digital values at a rate defined by a data period. The output circuit is configured to receive the sequence of digital values from the source device, generate a copy of each digital value at a predetermined point during the respective data period, and responsive to initiation of a data transaction during a given data period but before the predetermined point, output the digital value from the source device, whereas responsive to initiation of a data transaction during the given data period but after the predetermined point, output the copy of the digital value.

BRIEF DESCRIPTION OF THE DRAWINGS

For a detailed description of various examples, reference will now be made to the accompanying drawings in which.

DETAILED DESCRIPTION

As noted above, a source device may generate data to be received by a receiving device. In the example described herein, the source device includes an analog-to-digital converter (ADC) but may comprise other types of devices in other systems. The ADC converts an analog input signal into a digital value and provides the digital value to an output circuit. The output circuit includes a shift register which serially shifts out the digital value to the receiving device. The receiving device generates a clock, which is provided to the output circuit to shift out the data value one bit at a time on a serial communication link. Logic within the output circuit ensures that valid data is shifted out of the shift register.

The ADC generates data values at a predetermined rate and thus has a predetermined data period. The output circuit causes a copy of each data value from the ADC to be made during the respective data period. In one example, the data value copy is made approximately halfway through the data period. In this context, halfway through the data period may comprise a point that is in the range of 40% to 60% of the data period. The output circuit also generates a control signal (shown as DIRECT_BACKUP in the example below). DIRECT_BACKUP is asserted high upon the ADC producing a data value and is asserted low after the copy is made approximately halfway through the data period. With a copy made halfway through the data period, DIRECT_BACKUP will be high for the first half of each data period and low for the second half of each data period. If the receiving device initiates a cycle to retrieve the ADC's data while DIRECT_BACKUP is high, the ADC's data value is shifted out through the shift register. However, if the receiving device initiates a cycle to retrieve the ADC's data while DIRECT_BACKUP is low (which occurs after the data value copy is made), the copy of the ADC's data value is shifted out through the shift register. Because DIRECT_BACKUP is high only for the first half of the data period, shifting out the ADC's original data (not the copy) when DIRECT_BACKUP is high ensures that there will be a sufficient amount of time to load the ADC's current data value into the output shift register before the ADC outputs the next data value. Similarly, a load of the ADC's data value copy when DIRECT_BACKUP is low ensures that that there is sufficient time from DIRECT_BACKUP detected low to loading the copy of the data value before the next copy is made in a subsequent data period. The output circuit described herein shifts out the digital values without the need for a read command.

Figure 1:
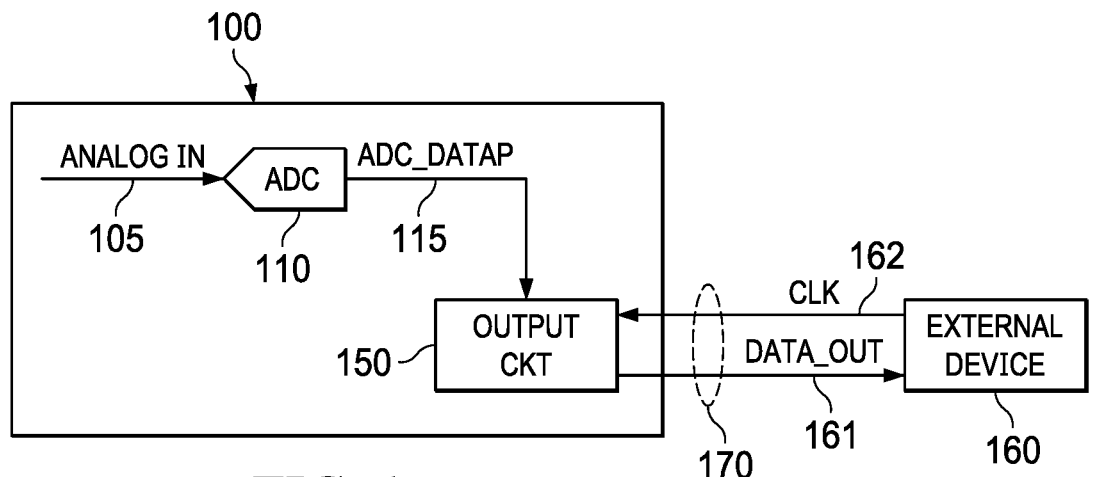
FIG. 1 illustrates a system having an analog-to-digital converter (ADC) and output circuit in accordance with an example.

FIG. 1 shows an example of a device 100. Device 100 may be an integrated circuit (IC) and includes a data source device coupled to an output circuit 150. In this example, the source device comprises an ADC 110, but can include other types of data source devices that produce digital output values. Other components may be included within device 100. The ADC 110 converts an analog input signal (ANALOG IN) 105 to a digital value (ADC_DATAP) 115. The output circuit 150 receives ADC_DATAP 115 from ADC 110 and serially shifts out its bits as DATA_OUT 161 to an external device 160 (external with respect to device 100). The external device 160 generates a clock signal (CLK) 162 to be used by the output circuit 150 to shift out the bits of DATA_OUT 161. In the example of FIG. 1, external device 160 is shown external to device 100, but in other examples, device 160 is part of device 100 (e.g., ADC 110, output circuit 150, and device 160 are provided on the same integrated circuit). The communication link 170 between devices 100 and 160 may comprise a serial link such as, for example, Serial Peripheral Interconnect (SPI) or Inter-Integrated Circuit (I2C). Further, although examples are described in which a clock is submitted from the external device 160 to the output circuit 150, in other examples, the principles described herein are applicable to other types of interfaces (e.g., universal asynchronous receiver/transmitter (UART)) that do not use a clock.

Figure 2:
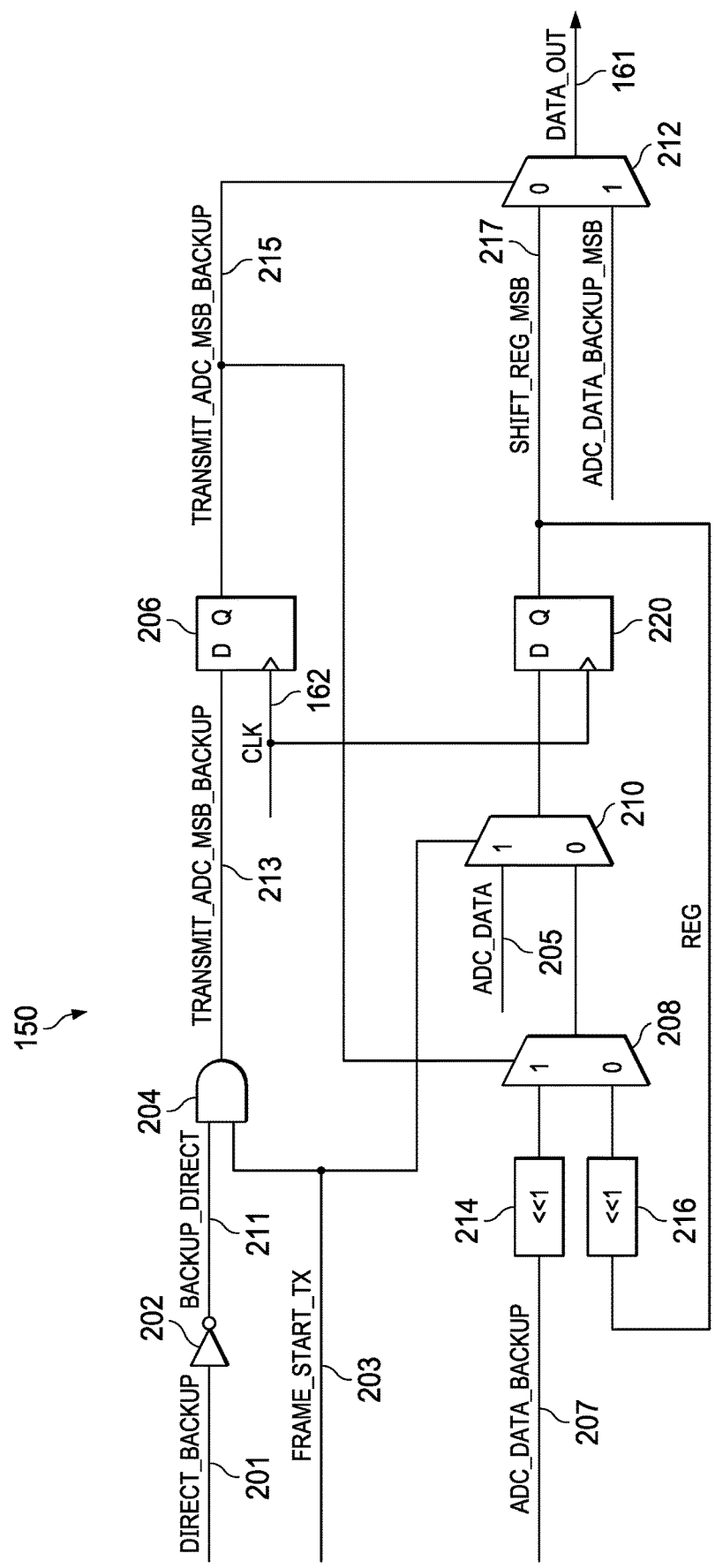
FIG. 2 shows an example of at least a portion of the output circuit of FIG. 1.
Figure 5:
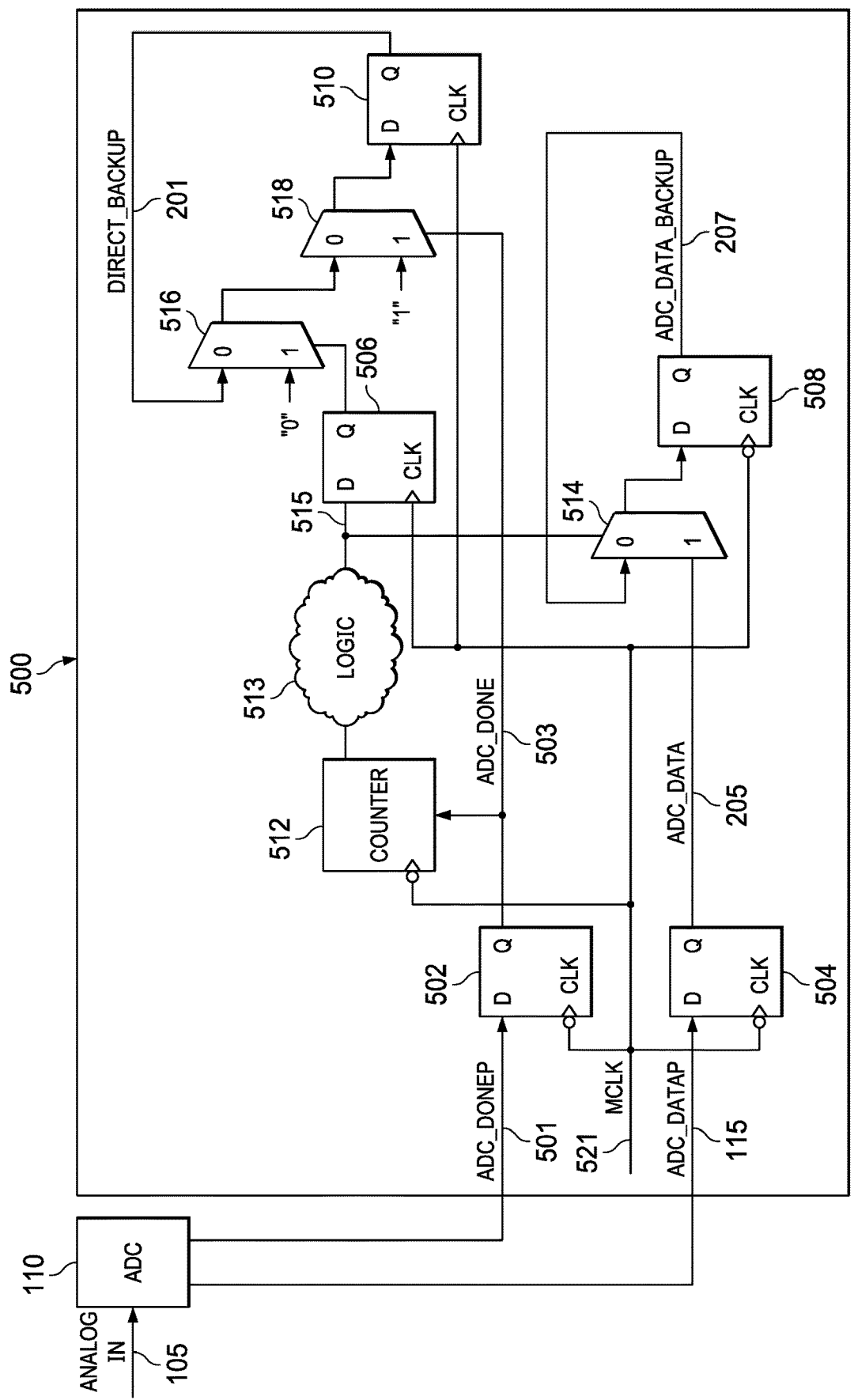
FIG. 5 shows an example of another portion of the output circuit of FIG. 1.
Figure 6A:
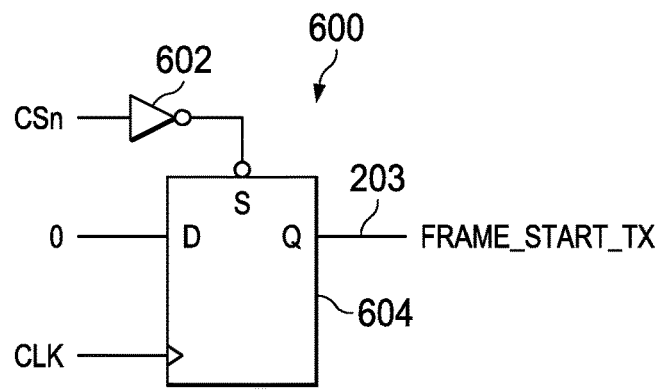
FIG. 6A shows an example of a circuit within the system of FIG. 1 to generate a frame start signal usable by the output circuit.
Figure 7A:
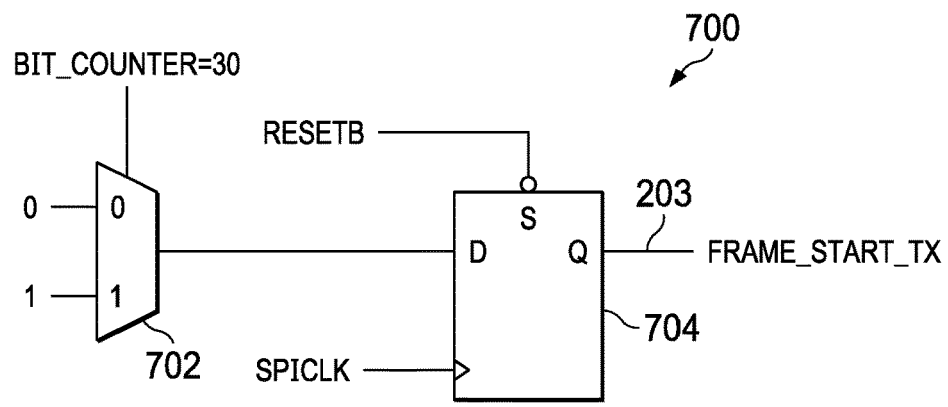
FIG. 7A shows an example of a circuit within the system of FIG. 1 to generate the frame start signal usable by the output circuit.

FIG. 2 shows an example of a portion of output circuit 150. As shown, output circuit 150 includes an inverter 202, an AND gate 204, a data (D) flip-flop 206, multiplexers 208, 210, and 212, shifters 214 and 216, and register 220. The example output circuit 150 of FIG. 2 receives input control signals DIRECT_BACKUP 201 and FRAME_START_TX 203. The purpose of these control signals is described below and the example circuits of FIGS. 5, 6A, and 7A illustrate how the control signals are generated. FIG. 2 also shows ADC_DATA 205 and ADC_DATA_BACKUP 207 as inputs to the circuit shown. ADC_DATA 205 is derived from ADC_DATAP 115 and ADC_DATA_BACKUP 207 is a copy of ADC_DATA 205 that is made approximately halfway through the data period. FIG. 5 (discussed below) shows an example of how ADC_DATA 205 and ADC_DATA_BACKUP 207 are generated.

The input of inverter 202 receives DIRECT_BACKUP 201. The output of inverter 202 (which provides the logically inverted version of DIRECT_BACKUP 201 and designated as BACKUP_DIRECT 211) is coupled to an input of AND gate 204. FRAME_START_TX 203 is provided to the other input of AND gate 204 as well as to a control input of multiplexer 210. The output of AND gate 204 provides a signal designed TRANSMIT_ADC_MSB_BACKUP 213 and is coupled to the D input of D flip-flop 206. The Q output of D flip-flop 206 is coupled to a control input of multiplexer 212 and to a control input of multiplexer 208. The signal from the Q output of flip-flop 206 is TRANSMIT_ADC_MSB_BACKUP 215.

The copy of the ADC_DATA 205 (i.e., ADC_DATA_BACKUP 207) is generated during each ADC data period and is provided to an input of shifter 214. Shifter 214 produces an output that comprises the bits of its input shifted left by one-bit position. For example, for an eight-bit value, output bit 7 of the output of shifter 214 is bit 6 of its input, output bit 6 is input bit 5, and so on. Output bit 0 can be either a 0 or a 1 (a "don't care").

Multiplexer 208 has a "1" input, a "0" input, and an output. Each input and the output of multiplexer 208 are multi-bit signal lines. That is, the 1-input of multiplexer 208 comprises an m-bit input, where m is 1 or greater. In the example, ADC 110 produces 8-bit digital values. In that case, ADC_DATA 205 and ADC_DATA_BACKUP 207 are 8-bit values. Further, the 0 and 1 inputs of multiplexer 208 and 210 also are 8-bit inputs, and the outputs of multiplexers 208 and 210 are 8-bit outputs.

The output of multiplexer 208 is coupled to the 0-input of multiplexer 210. ADC_DATA 205 is coupled to the 1-input of multiplexer 210. The output of multiplexer 210 is coupled to the D input of register 220. The D input of register 220 is an m-bit (e.g., m=8) input and the Q output of register 220 also is an m-bit (e.g., 8) output.

Figure 3:
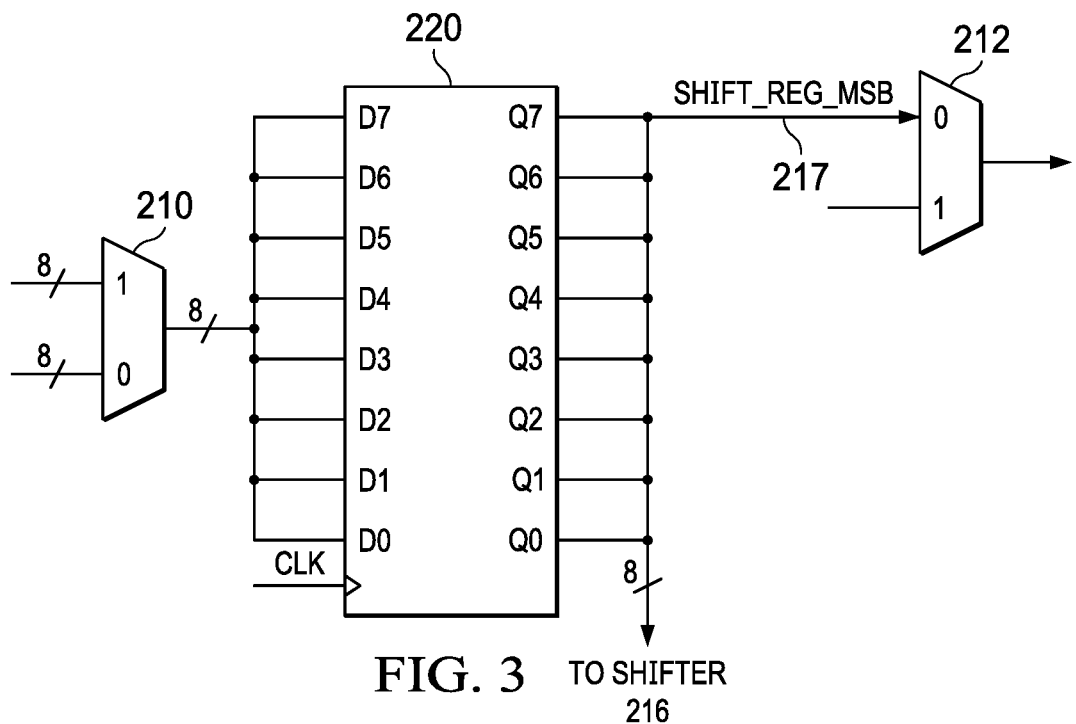
FIG. 3 illustrates additional detail for a shift register within the output circuit.

Referring briefly to FIG. 3, the m-bit D input and the m-bit Q output of flip-flop 220 is illustrated for the example in which m is 8. The 8-bit output of multiplexer 210 is coupled to inputs D7:D0 of register 220. The most significant bit (MSB) of the Q output of register 220 (i.e., Q7) is coupled to the 0-input of multiplexer 212. The MSB Q7 output of register 220 is labeled SHIFT_REG_MSB 217 in FIGS. 2 and 3.

FIG. 2 illustrates that the Q output of register 220 (Q7:Q0) is coupled to an input of shifter 216. Like shifter 214, shifter 216 shifts the bits of its input (Q output of register 220) to the left by one 1-bit position. The output of shifter 214 is coupled to the 1-input of multiplexer 208 and the output of shifter 216 is coupled to the 0-input of multiplexer 208. D flip-flop 206 and register 220 are clocked with the same clock (CLK 162). CLK 162 is driven by external device 160 when attempting to serially shift out DATA_OUT 161 from output circuit 150.

Figure 4:
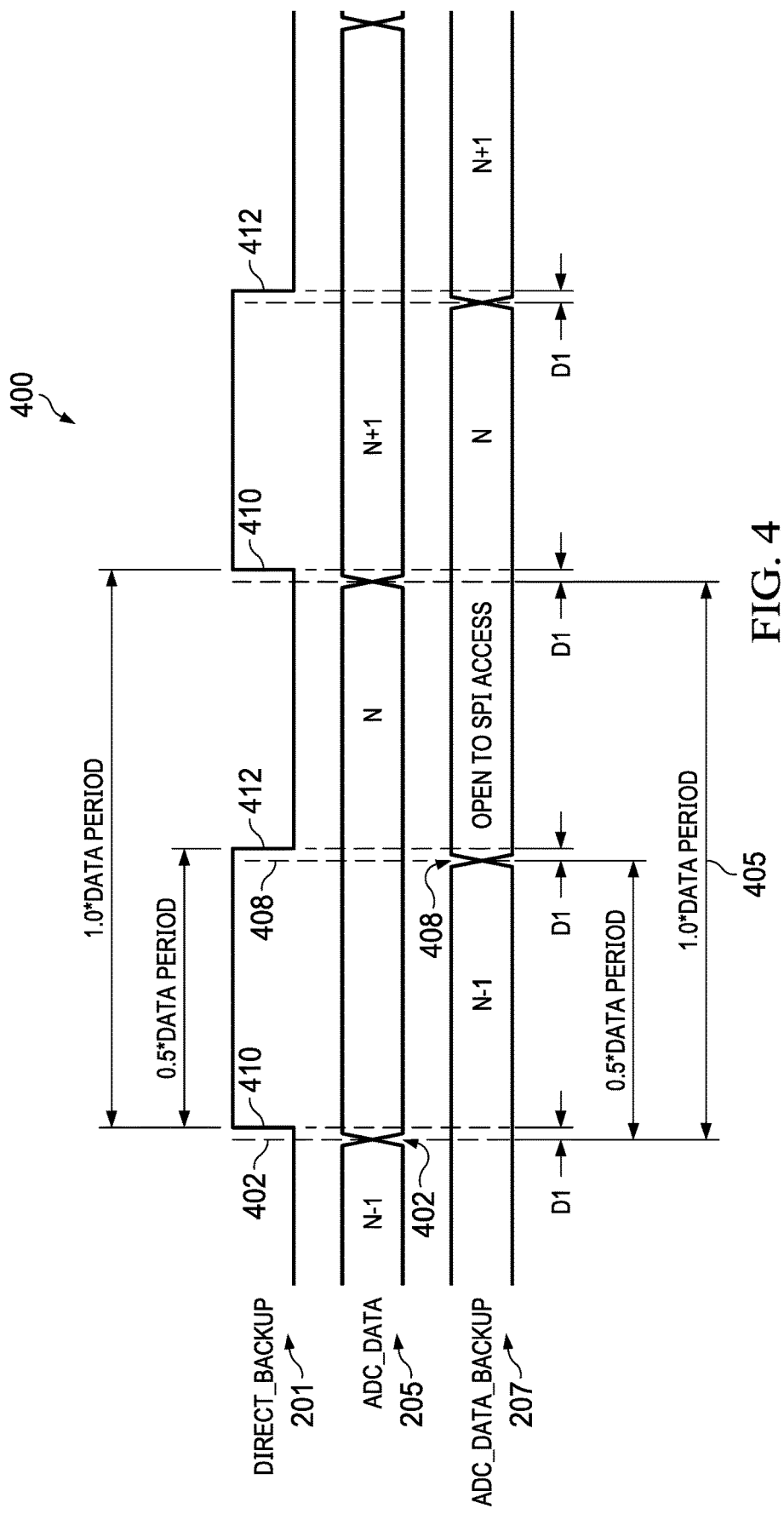
FIG. 4 shows an example of timing diagram illustrating the operation of the output circuit.

FIG. 4 illustrates an example timing diagram for some of the signals depicted in the output circuit 150 of FIG. 2. The signals shown in FIG. 4 include DIRECT_BACKUP 201, ADC_DATA 205, and ADC_DATA_BACKUP 207. The ADC 110 produces digital data values at a rate having an ADC data period 405 which is the period of time between ADC output digital values. FIG. 4 illustrates three consecutive ADC_DATA 205 data values N−1, N, and N+1. Each ADC_DATA data value is copied in this example halfway through each data period 405. DIRECT_BACKUP 201 has a rising edge 410 that occurs a delay D1 after ADC_DATA becomes available from ADC 110. Delay D1 ensures ADC_DATA has had sufficient time to settle before an attempt is made to retrieve the data. A falling edge 412 occurs for DIRECT_BACKUP 201 a delay D1 after ADC_DATA_BACKUP becomes available. As such, DIRECT_BACKUP 201 is high for the first half of each data period 405 and low for the second half of each data period (taking into account delay D1). Whether the output circuit 150 makes ADC_DATA 205 or ADC_DATA+BACKUP 207 available for serially shifting out to external device 160 depends on whether DIRECT_BACKUP 201 is high or low when the transaction begins to start shifting out the data to the external device 160. If DIRECT_BACKUP 201 is high, the output circuit 150 responds by providing DATA_OUT 205 available to shift out as DATA_OUT 161. However, if DIRECT_BACKUP 201 is low, the output circuit 150 responds by providing DATA_OUT BACKUP 207 available to shift out as DATA_OUT.

FRAME_START 203 is a control signal that is high when the MSB of the data to be shifted out is ready to be shifted out and becomes low after the MSB is shifted out and remains low for each of the remaining bits of the data to be shifted out. Example circuits for generating FRAME_START_TX are shown in FIGS. 6A and 7A and described below. In one example, CLK is idle (e.g., logic low) until external device 160 initiates a transaction to cause output circuit 150 to begin shifting out the next available data value from ADC 110. To initiate the serial data transfer, among other things (e.g., asserting a chip select signal), external device 160 begins to produce pulses for CLK 162.

Before the initial pulse of CLK 162, DIRECT_BACKUP 201 is either high or low depending on which half of the data period is occurring and FRAME_START_TX also is high. Assuming the first pulse of CLK occurs while DIRECT_BACKUP 201 is logic high (meaning that ADC_DATA 205 should be shifted out as DATA_OUT 161 to the external device 160), BACKUP_DIRECT 211 will be logic low and thus the output of AND gate 204 will be low. The D input of the D flip-flop 206 thus also is low. Upon a rising edge of the first pulse of CLK 162, D flip-flop 206 will produce a Q output (TRANSMIT_ADC_MSB_BACKUP 215) as logic low (0). The 0 for TRANSMIT_ADC_MSB_BACKUP 215 will cause multiplexer 212 to select the 0-input as DATA_OUT 161. With FRAME_START_TX 203 being logic high for the MSB, the 1 input of multiplexer 210 will be selected as the output to the D input of register 220. ADC_DATA 205 is provided to the 1-input of multiplexer 210 and, with the 1-input being selected due to FRAME_START_TX 203 being high, the Q output of register 220 will be equal to ADC_DATA 205 upon register 220 being clocked by the initial rising edge of CLK 162. As explained above and illustrated in FIG. 3, Q7 from register 220 is coupled to the 0-input of multiplexer 212 and Q7 (MSB of ADC_DATA 205) is shifted out from multiplexer 212 to the external device 160.

Once the MSB of ADC_DATA 205 is transmitted to the external device 160, FRAME_START_TX 203 is asserted low and remains low for the time that the remaining bits of ADC_DATA are shifted out to the external device 160. With FRAME_START_TX being low, the signals on the 0-input of multiplexer 210 are selected to be provided to the D input of register 220. The Q output bits from register 220 are left-shifted by shifter 216 and the left-shifted bits are then provided to the 0-input of multiplexer 208. With FRAME_START_TX being low, TRANSMIT_ADC_MSB_BACKUP 215 will be low regardless of the state of DIRECT_BACKUP 201 for each successive CLK pulse. The output of multiplexer 208 is provided to the 0-input of multiplexer 210 and the output of multiplexer 210 is provided to the D input of register 220. The next rising edge of CLK 162 clocks the register 220 and the ADC_DATA left-shifted bits are provided on the Q output of register 220. The bit from Q7 is provided through multiplexer 212 as the next serially-shifted bit of DATA_OUT 161. This process repeats until all of the bits of ADC_DATA are shifted out to external device 160. The combination of shifter 216 and register 220 thus comprises a shift register.

The operation of the output circuit 150 is now described when the first pulse of CLK occurs when DIRECT_BACKUP 201 is low meaning that ADC_DATA_BACKUP 207 is to be provided to the external device 160. With DIRECT_BACKUP 201 being low, BACKUP_DIRECT 211 will be high and, the first rising edge of CLK will cause TRANSMIT_ADC_MSB_BACKUP 215 to be high (i.e., 1). The 1-input of multiplexer 212 is therefore selected. The MSB of ADC_DATA_BACKUP (ADC_DATA_BACKUP_MSB) is provided as the output of multiplexer 212 for transmission as the MSB of DATA_OUT 161 to the external device 160.

Upon the next pulse of CLK, FRAME_START_TX 203 is low and remains low until the remaining bits of DATA_OUT are provided to the external device 160. FRAME_START_TX 203 causes TRANSMIT_ADC_MSB_BACKUP 215 to be low thereby selecting the 0-input of multiplexer 212 until the remaining bits of DATA_OUT have been provided to the external device.

Further (and for the continued case of DIRECT_BACKUP 201 being low), just before the first pulse of CLK occurs, ADC_DATA_BACKUP is generated and provided to the input of shifter 214 and FRAME_START_TX is low and TRANSMIT_ADC_MSB_BACKUP 215 is high. With FRAME_START_TX being low and TRANSMIT_ADC_MSB_BACKUP 215 being high, the left-shifted version of ADC_DATA_BACKUP is provided through multiplexers 208 and 210 to the D input of register 220.

Responsive to the occurrence of the first rising edge of CLK (with DIRECT_BACKUP 201 being low), (1) D flip-flop 206 is clocked resulting in the MSB of ADC_DATA_BACKUP to be provided through multiplexer 212 and (2) register 220 is clocked to thereby provide the left-shifted bits of ADC_DATA_BACKUP as the Q output of register 220 and the next most significant bit of ADC_DATA_BACKUP to the 0-input of multiplexer 212. Upon occurrence of the next pulse of CLK 162, FRAME_START_TX 203 will be low and TRANSMIT_ADC_MSB_BACKUP 215 from D flip-flop 206 will be low thereby causing the 0-input of multiplexer 212 to be selected. The 0-input of multiplexer 212 will have the next most significant bit of ADC_DATA_BACKUP 207 as a result of the left-shift function performed by shifter 216. Both FRAME_START_TX 203 and TRANSMIT_ADC_MSB_BACKUP 215 will be low for each of the following pulses of CLK 162 until all of ADC_DATA_BVACKUP is shifted out to the external device 160. The process repeats with the Q output bits of register 220 being repeatedly left-shifted by shifter 216 and provided back to the D input of the register 220.

FIG. 5 shows the ADC 110 coupled to circuit 500. Circuit 500 may be part of output circuit 150 or may be separate from output circuit 150. Circuit 500 includes D flip-flops 502, 504, 506, 508, and 510, counter 512, logic 513, and multiplexers 514, 516, and 518. The ADC 110 provides its digital output 115 (ADC_DATAP) to the D input of flip-flop 504. The D input of flip-flop 504 is a multi-bit input to receive all of the bits of ADC_DATAP. The Q output of flip-flop 504 also is a multi-bit output. Similarly, the D input and Q output of flip-flop 508 also are a multi-bit input input/output.

The ADC 110 also generates a single-bit signal called ADC_DONEP 501 and provides that signal to the D input of flip-flop 502. ADC_DONEP 501 is asserted to one logic state to another (e.g., from low to high) in response to the ADC 110 having generated a new digital value (ADC_DATAP) 115. The time difference between the falling edge used on flip-flop 502 and the rising edge used on flip-flop 510 implements the time delay D1 shown in FIG. 4.

The Q output of flip-flop 504 is coupled to a 1-input of multiplexer 514 and provides ADC_DATA 205 (see FIGS. 2 and 4) to the multiplexer. That is, ADC_DATA 205 shown in FIG. 2 is taken from the Q output of flip-flop 504. The output of multiplexer 514 is coupled to the D input of flip-flop 508. The inputs and outputs of multiplexer 514 are multibit inputs and outputs. The Q output of flip-flop 508 is coupled to the 0-input of multiplexer 514 and provides ADC_DATA_BACKUP 207.

The Q output of flip-flop 502 provides a signal called ADC_DONE and is coupled to a control input of multiplexer 518 and to the counter 512. The output of counter 512 is coupled to an input of logic 513. The output of logic 513 is coupled to the D input of flip-flop 506. The Q output of flip-flop 506 is coupled to a control input of multiplexer 516. The output of multiplexer 516 is coupled to the 0-input of multiplexer 518. A logic "1" (high) is coupled to the 1-input of multiplexer 518. The output of multiplexer 518 is coupled to the D input of flip-flop 510. The Q output of flip-flop 510 is coupled to the 0-input of multiplexer 516. The Q output of flip-flop 510 provides the signal DIRECT_BACKUP 201 (see FIGS. 2 and 4).

The example circuit 500 of FIG. 5 also includes a clock signal designated MCLK 521. MCLK 521 is the clock used inside the ADC 110 to generate the data ADC_DATAP 125 and ADC_DONEP 501. MCLK 521 and CLK 162 are independent and may not be related to each other. MCLK 521 is coupled to the clock inputs of all of the flip-flops 502, 504, 506, 508, and 510 in FIG. 5. The clock inputs of flip-flops 502, 504, and 508 are "negative" inputs and the clock inputs of flip-flops 506 and 510 are "positive" inputs meaning that a high-to-low transition of MCLK 521 advances (clocks) flip-flops 502, 504, and 508 to their next state while a low-to-high MCLK transition advances flip-flops 506 and 510 to their next state. As such, a falling edge of MCLK 521 clocks flip-flops 502, 504, and 508, while the rising edge of MCLK 521 clocks the flip-flops 506 and 510.

Responsive to ADC_DONE 503 being asserted high, the counter begins to count pulses of MCLK 521. The output from counter 512 is provided to logic 513, which comprises one or more logic gates, comparators, etc. (Boolean logic). Responsive to the counter 512 counting for one-half of an ADC data period, the logic 513 changes its output control signal 515 from low to high thereby causing multiplexer 514 to switch its output from its 0-input to its 1-input. Before the change of inputs, the control signal from logic 513 is low, and the Q output of flip-flop 508 is fed back to its D input via multiplexer 514. The Q output of flip-flop 508 comprises a copy of ADC_DATA 205 (ADC_DATA_BACKUP 207). When the control signal 515 becomes logic high (which occurs half-way through the ADC data period), ADC_DATA 205 is provided through multiplexer 514 to the D input of flip-flop 508. Upon the next falling edge of MCLK, the flip-flop 508 clocks through ADC_DATA to its Q output (ADC_DATA_BACKUP 207). The control signal 515 from logic 513 then reverts back to logic low, and the feedback loop from the Q output of flip-flop 508 to the 0-input of the multiplexer 514 causes ADC_DATA_BACKUP 207 to remain on the Q output of flip-flop 508. The timing of making a copy of ADC_DATA 205 is shown in FIG. 2 and described above as well.

ADC_DONE 503 is a pulse that goes high on the falling edge and for one cycle of MCLK 521. ADC_DONE 503 is also the control signal for multiplexer 518. The 1-input of multiplexer 518 receives a fixed logic high (1) and thus through flip-flop 510 DIRECT_BACKUP 201 is asserted high for the first half of the ADC data period when ADC_DONE 503 changes from logic low to high as illustrated in FIG. 4. After ADC_DONE 503 returns to logic low the control input to multiplexer 518 changes to the 0-input. While the counter 512 is counting MCLK 521 pulses the output of flip-flop 506 remains at logic low. On the falling edge of MCLK 521 after counter 512 counts half a data period, the output of logic 513 asserts high and causes the D input 515 of flip-flop 506 to go high. On the next rising edge of MCLK, the Q output of flip-flop 506 goes high and causes the multiplexer 516 to switch to 1-input where a logic "0" (low) couples into the 0-input of multiplexer 518 and to the D input of flip-flop 510. The subsequent falling edge of MCLK 521 after the Q output of flip-flop 506 goes high the multiplexer 514 couples ADC_DATA 205 to the Q output of flip-flop 508 through the 1-input. The rising edge of MCLK 521 after flip-flop 508 stores the ADC_DATA_BACKUP 207, flip-flop 510 Q output causes DIRECT_BACKUP 201 to go low. In this example, through the use of falling edge flip-flop 508 and rising edge flip-flop 510 the delay D1 is achieved as illustrated in FIG. 4.

Figure 6B:
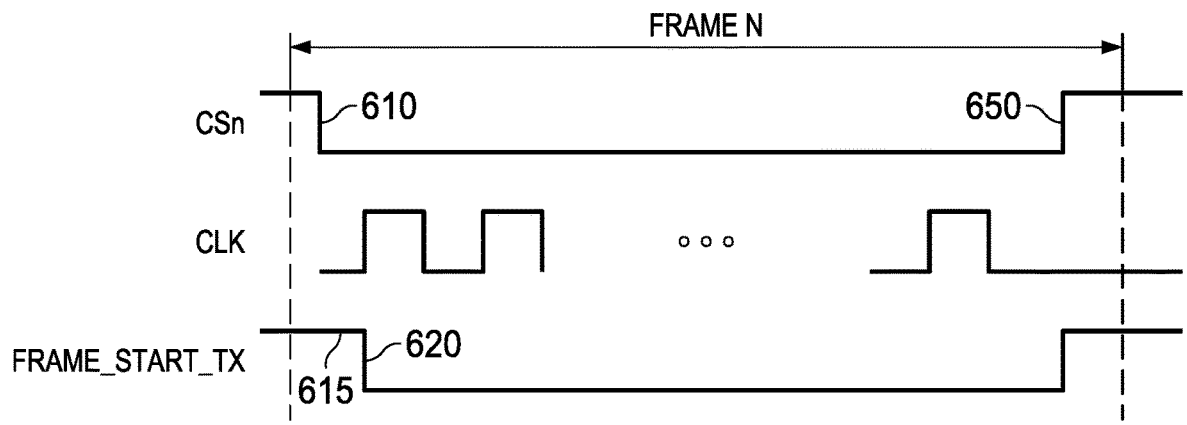
FIG. 6B illustrates an example of timing diagram of the circuit of FIG. 6A.

FIGS. 6A and 7A illustrate two different implementations for generating FRAME_START_TX. FIG. 6A illustrates an implementation of a "4-wire" SPI interface. The four signals include Data In (DIN), Data Out (DOUT), SCLK, and chip select (CSn). FIG. 6B illustrates a timing diagram corresponding to the implementation of FIG. 6A. At 610, CSn transitions from high to low to select the chip (e.g., device 100) to thereby retrieve a DATA_OUT value 161. CLK was low prior to CSn being asserted low, and then begins to provide clock pulses as shown until CSn is deasserted at rising edge 650.

In FIG. 6A, CSn is provided to an input of inverter 602 and the output of inverter 602 is coupled to a set (S) input of flip-flop 604. The D input of flip-flop 604 comprises a low (0) and CLK is provided to the clock input of flip-flop 604. When CSn is high (prior to falling edge 610 and after rising edge 650, the S input of flip-flop is low thereby causing flip-flop 604 to be in its set state in which the Q output is high. The Q output of flip-flop 604 provides the signal FRAME_START_TX 203. As such, FRAME_START_TX 203 is high prior to CSn being asserted low as shown at 615. When CSn is asserted low, the S input of flip-flop 604 is asserted high thereby releasing the flip-flop from its set state. The MSB of the output data is provided to the external device at that time as well. Upon the first pulse of CLK after CSn is asserted low, flip-flop 604 clocks through the 0 on its D input and thus FRAME_START_TX 203 is forced low as shown in FIG. 6B. FRAME_START_TX 203 remains low as the remaining bits of DATA_OUT are provided to the external device with each successive pulse of CLK as described above.

Figure 7B:
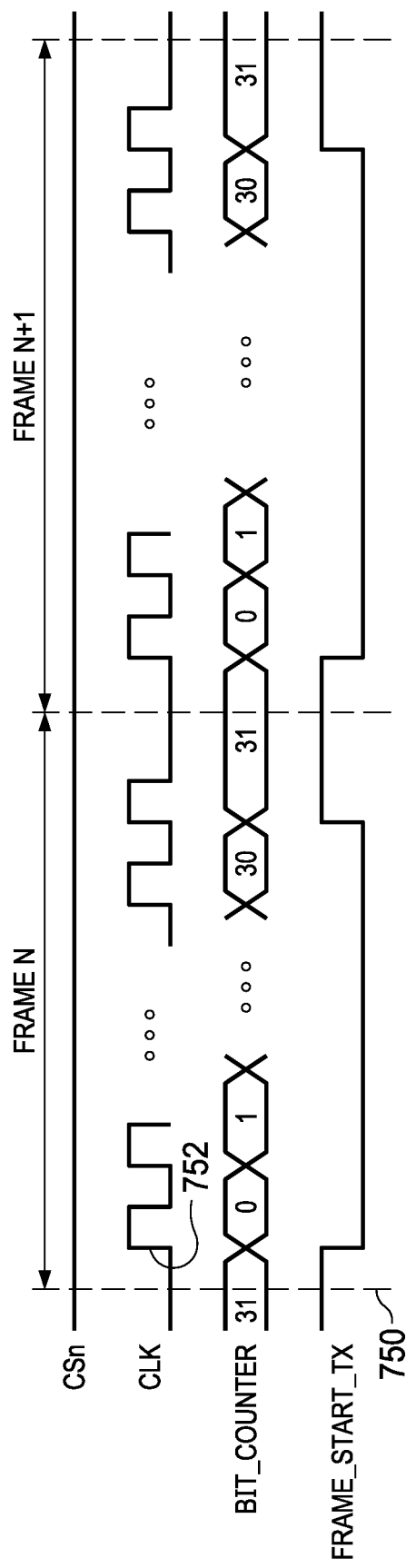
FIG. 7B illustrates an example of timing diagram of the circuit of FIG. 7A.

FIG. 7A and its associated timing diagram of FIG. 7B illustrates how FRAME_START_TX 203 can be generated with a "3-wire" SPI interface. In a 3-wire SPI interface, CSn remains low. FIG. 7A shows a multiplexer 702 coupled to a D flip-flop 704. The signal RESETB is the reset signal to the output circuit and is asserted (low) at the beginning to set the output circuit into the known state. The control to the multiplexer 702 is shown as "BIT_COUNTER=30?" which means that the control signal to multiplexer 702 is 1 when BIT_COUNTER value is equal to 30 (as determined by way of a comparator, not shown) and 0 otherwise. As result, when the value of BIT_COUNTER is 30, the multiplexer 702 control signal is 1, which causes the multiplexer to select the "1" input. The "1" input is tied to "1" and thus a 1 is fed through the multiplexer 702 to the D input of flip-flop 704. The Q output of flip-flop 704 is 1 after the following CLK rising edge to set FRAME_START_TX to 1 for the frame start clock cycle (752) immediately after the vertical dash line 750. The value for BIT_COUNTER to select the 1 input of the multiplexer is set to 30 because the SPI frame length is assumed to be 32 bits, that is, 32 clock cycles per frame. The 8 bits of ADC data are among the 32 bits—the first 8 bits in this example.

The embodiments described herein do not require that a read command be provided to device 100 before the data is output by output circuit 150. Further, the output circuit 150 ensures integrity of the data being output despite the ADC 110 and the external device 160 possibly operating in two different clocks domains. Also, the output circuit 150 can be used with a variety of different protocols on communication link 170 (e.g., SPI, I2C, UART, etc.).

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit, comprising:
   a source device having an output, the source device configured to produce a sequence of digital values at a rate defined by a data period;
   an output circuit coupled to the output of the source device, the output circuit configured to:
   receive the sequence of digital values from the source device;

generate a copy of each digital value at a predetermined point during the respective data period; and responsive to initiation of a data transaction for a given digital value from the source device during a given data period but before the predetermined point, output the given digital value from the source device; and responsive to initiation of a data transaction for a given digital value from the source device during the given data period but after the predetermined point, output the copy of the given digital value.

2. The circuit of claim 1, wherein the output circuit includes:
a first flip-flop including a data input and an output; and
a multiplexer including first, second and control inputs and an output, the output of the first flip-flop coupled to the control input of the multiplexer, and the first input of the multiplexer coupled to a most significant bit of the copy of the given digital value.

3. The circuit of claim 2, further including a second flip-flop having an input and an output, the output of the second flip-flop coupled to the second input of the multiplexer.

4. The circuit of claim 3, further including:
a first shifter having an input and an output, the copy of the given digital value provided to the input of the first shifter; and
a second shifter having an input and an output, the output of the second flip-flop coupled to the input of the second shifter.

5. The circuit of claim 1, wherein the output circuit includes:
a first multiplexer having first, second, and control inputs and an output;
a first flip-flop having a data input and an output, the output of the first multiplexer coupled to the data input of the first flip-flop; and
a first shifter having an input and an output, the output of the first flip-flop coupled to the input of the first shifter.

6. The circuit of claim 5, further including:
a second shifter having an input and an output, the copy of the given digital value provided to the input of the second shifter; and
a second multiplexer having first, second, and control inputs and an output, the output of the first shifter coupled to the first input of the second multiplexer and the output of the second shifter coupled to the second input of the second multiplexer, and the output of the second multiplexer is coupled to the first input of the first multiplexer.

7. The circuit of claim 6, wherein the second input of the first multiplexer is configured to receive each successive digital value of the sequence of digital values from the source device.

8. The circuit of claim 7, wherein the control input of the first multiplexer is configured to receive a control signal that is at a first logic state for a most significant bit of the given digital value or the copy of the given digital value being output and at a second logic state for a remainder of the bits of the given digital value or the copy of the given digital value being output.

9. The circuit of claim 1, wherein the predetermined point during each data period is approximately half-way through each respective data period.

10. The circuit of claim 1, wherein the source device includes an analog-to-digital converter.

11. A circuit, comprising:
a first flip-flop having a data input and an output;
a first multiplexer having first, second, and control inputs and an output, the output of the first flip-flop coupled to the control input of the first multiplexer;
a second multiplexer having first, second, and control inputs and an output;
a second flip-flop having a data input and an output, the output of the second multiplexer is coupled to the data input of the second flip-flop; and
a first shifter having an input and an output, the output of the second flip-flop is coupled to the input of the first shifter, and the first input of the second multiplexer is configured to receive a shifted signal from the output of the first shifter.

12. The circuit of claim 11, further including a third multiplexer coupled between the first shifter and the first input of the second multiplexer.

13. The circuit of claim 11, further including a third multiplexer having first, second, and control inputs and an output, the control input of the third multiplexer is coupled to the output of the first flip-flop, and the first input of the third multiplexer is coupled to the output of the first shifter.

14. The circuit of claim 13, further including a second shifter having an input and an output, the output of the second shifter coupled to the second input of the third multiplexer.

15. The circuit of claim 13, wherein the control input of the second multiplexer is configured to receive a control signal that is at a first logic state for a most significant bit of a digital value being output by the circuit and at a second logic state for a remainder of the bits of the digital value being output.

16. A circuit, comprising:
an analog-to-digital converter (ADC) device having an output, the ADC configured to produce a sequence of digital values at a rate defined by a data period;
a first multiplexer having first, second, and control inputs and an output, the second input of the first multiplexer configured to receive each of the sequence of digital values from the ADC;
a first shifter having an input and an output, the input of the first shifter configured to receive a copy of each of the sequence of digital values, each respective copy being made approximately halfway during the respective data period; and
a second multiplexer having first, second, and control inputs and an output, the second input of the second multiplexer coupled to the output of the first shifter, and the output of the second multiplexer coupled to the first input of the first multiplexer.

17. The circuit of claim 16, further including a first flip-flop having a data input and an output, the data input of the first flip-flop is coupled to the output of the first multiplexer.

18. The circuit of claim 17, further including a second shifter having an input and an output, the output of the second shifter is coupled to the first input of the second multiplexer, and the output of the first flip-flop is coupled to the input of the second shifter.

19. The circuit of claim 17, further including a third multiplexer having first, second, and control inputs and an output, the output of the first flip-flop is coupled to the first input of the third multiplexer, and the second input of the third multiplexer is configured to receive a most significant bit of a copy of a digital value.

20. The circuit of claim 19, further comprising a second flip-flop having an output, the output of the second flip-flop coupled to the control inputs of the second and third multiplexers.

* * * * *